United States Patent
Lee et al.

(10) Patent No.: US 9,755,002 B2
(45) Date of Patent: Sep. 5, 2017

(54) ORGANIC LIGHT-EMITTING DISPLAY PANEL AND METHOD OF MANUFACTURING THE SAME

(71) Applicant: SAMSUNG DISPLAY CO., LTD., Yongin, Gyeonggi-Do (KR)

(72) Inventors: Seongmin Lee, Yongin (KR); Hyomin Kim, Yongin (KR); Jongdae Lee, Yongin (KR)

(73) Assignee: Samsung Display Co., Ltd., Yongin, Gyeonggi-do (KR)

( * ) Notice: Subject to any disclaimer, the term of this patent is extended or adjusted under 35 U.S.C. 154(b) by 71 days.

(21) Appl. No.: 14/748,612

(22) Filed: Jun. 24, 2015

(65) Prior Publication Data

US 2016/0163247 A1   Jun. 9, 2016

(30) Foreign Application Priority Data

Dec. 3, 2014   (KR) .................. 10-2014-0172456

(51) Int. Cl.
  *G09G 3/30*   (2006.01)
  *H01L 27/32*   (2006.01)
  *G09G 3/3233*   (2016.01)

(52) U.S. Cl.
  CPC ....... *H01L 27/3216* (2013.01); *G09G 3/3233* (2013.01); *H01L 27/3262* (2013.01); *G09G 2300/0426* (2013.01); *G09G 2300/0814* (2013.01); *G09G 2300/0819* (2013.01); *G09G 2300/0842* (2013.01);
  (Continued)

(58) Field of Classification Search
  CPC ............... G09G 3/2003; G09G 3/3233; G09G 2300/0452; G09G 2300/0819; G09G 2320/0242; G09G 2310/027; G09G 2320/0233; H01L 51/56; H01L 27/3216
  USPC .............................................. 345/76–87, 690
  See application file for complete search history.

(56) References Cited

U.S. PATENT DOCUMENTS

| 9,129,923 B1* | 9/2015 | Han ................... H01L 27/3248 |
| 2006/0076567 A1* | 4/2006 | Miyagawa ........... G09G 3/3291 257/94 |
| 2007/0120780 A1 | 5/2007 | Park et al. |

(Continued)

FOREIGN PATENT DOCUMENTS

| KR | 10-2007-0063127 A | 6/2007 |
| KR | 10-2007-0068777 A | 7/2007 |

(Continued)

*Primary Examiner* — Jennifer Nguyen
(74) *Attorney, Agent, or Firm* — Lee & Morse, P.C.

(57) ABSTRACT

An organic light-emitting display panel includes a first display region including a plurality of first sub-pixels and a second display region including a plurality of second sub-pixels. Each of the sub-pixels includes a pixel circuit having a driving transistor to output driving current to an output node based on a data signal, a storage capacitor to store a voltage difference between the driving voltage and the gate voltage of the driving transistor, a switching transistor to transfer the data signal to the driving transistor, and a light-emitter connected to emit light based on the driving current. An overlap area of the gate electrode of the driving transistor and an anode electrode of the light-emitter in the first sub-pixel is smaller than an overlap area of the gate electrode of the driving transistor and an anode electrode of the light-emitter in the second sub-pixel.

14 Claims, 6 Drawing Sheets

(52) U.S. Cl.
CPC ............ *G09G 2300/0861* (2013.01); *G09G 2310/0232* (2013.01); *H01L 27/3211* (2013.01)

(56) References Cited

U.S. PATENT DOCUMENTS

| | | |
|---|---|---|
| 2007/0132900 A1 | 6/2007 | Lee |
| 2007/0164288 A1 | 7/2007 | Oh et al. |
| 2010/0079419 A1* | 4/2010 | Shibusawa .......... H01L 27/3272 345/204 |
| 2013/0215345 A1 | 8/2013 | Kaneko et al. |
| 2014/0138644 A1* | 5/2014 | Park .................... H01L 27/3262 257/40 |

FOREIGN PATENT DOCUMENTS

| | | |
|---|---|---|
| KR | 10-2007-0106870 A | 11/2007 |
| KR | 10-2008-0030903 A | 4/2008 |
| KR | 10-2013-0078328 A | 7/2013 |

* cited by examiner

ORGANIC LIGHT-EMITTING DISPLAY PANEL AND METHOD OF MANUFACTURING THE SAME

CROSS-REFERENCE TO RELATED APPLICATION

Korean Patent Application No. 10-2014-0172456, filed on Dec. 3, 2014, and entitled, "Organic Light-Emitting Display Panel And Method Of Manufacturing The Same," is incorporated by reference herein in its entirety.

BACKGROUND

1. Field

One or more embodiments described herein relate to an organic light-emitting display panel and a method of manufacturing an organic light-emitting display panel.

2. Description of the Related Art

A display device may correct a reference gamma voltage using multi-time programming (MTP). This type of correction involves removing a deviation between actual luminance and a display luminance based on gray-scale data. To perform MTP correction, gray-scale data for an image signal is stored in a memory, and gray-scale data information is used to determine the data voltage to be supplied to a relevant pixel.

The amount of driving current for enabling a light-emitting element is based on the magnitude of a driving voltage. In order to set the driving voltage, a luminance ratio may be determined using MTP at a central portion of a panel. If in-plane current of a panel is constantly maintained, the luminance ratio is constantly applied to a plane. Hence, color deviation may not occur for a pixel.

However, in an actual panel, current deviation may occur in the plane to cause color deviation. Also, the efficiency of an organic light-emitting material emitting green light tends to be higher than materials emitting red and blue light. In a sub-pixel emitting green light, luminance may change significantly for small changes in applied current.

SUMMARY

In accordance with one or more embodiments, an organic light-emitting display panel includes a first display region including a plurality of first sub-pixels; and a second display region including a plurality of second sub-pixels, wherein each of the first and second sub-pixels includes a pixel circuit having: a driving transistor to output driving current to an output node based on a data signal; a storage capacitor to store a voltage difference between the driving voltage and a voltage of a gate electrode of the driving transistor; a switching transistor having a first electrode to receive the data signal and a second electrode connected to a first electrode of the driving transistor; and a light-emitter connected to the output node to emit light based on the driving current transferred through the output node, and an overlap area of the gate electrode of the driving transistor and an anode electrode of the light-emitter in the first sub-pixel is smaller than an overlap area of the gate electrode of the driving transistor and an anode electrode of the light-emitter in the second sub-pixel.

The first display region may be an edge region of the display panel. An amount of the driving current output from the pixel circuit of the first sub-pixel may be less than an amount of the driving current output from the pixel circuit of the second sub-pixel. An area of the gate electrode of the driving transistor of the first sub-pixel may be smaller than an area of the gate electrode of the driving transistor of the second sub-pixel. The driving transistor may be a P-type transistor.

The pixel circuit may include a compensation transistor to connect the gate electrode of the driving transistor to the second electrode of the switching transistor based on a first control signal; and an emission control transistor to output the driving current to the output node based on an emission control signal, wherein the driving transistor is to supply the driving current corresponding to the data signal to the light-emitter according to a switching operation of the switching transistor.

In accordance with one or more other embodiments, an organic light-emitting display panel includes a first display region including a plurality of first to third sub-pixels; and a second display region including a plurality of fourth to sixth sub-pixels, wherein each of the first to sixth sub-pixels includes a pixel circuit having: a driving transistor to output driving to an output node based on a data signal; a storage capacitor to store a voltage difference between the driving voltage and a voltage of a gate electrode of the driving transistor; and a switching transistor having a first electrode to receive the data signal and a second electrode connected to a first electrode of the driving transistor; and a light-emitter connected to the output node to emit light based on the driving current transferred through the output node, and an overlap area of the gate electrode of the driving transistor and an anode electrode of the light-emitter in the first sub-pixel is smaller than an overlap area of the gate electrode of the driving transistor and an anode electrode of the light-emitter in the fourth sub-pixel.

The first display region may be an edge region of the display panel. The first and fourth sub-pixels may emit a same color of light, the second and fifth sub-pixels may emit a same color of light, and the third and sixth sub-pixels may emit a same color of light. An area of the gate electrode of the driving transistor of the first sub-pixel may be smaller than an area of the gate electrode of the driving transistor of the fourth sub-pixel.

An amount of the driving current output from the pixel circuit of the first sub-pixel may be less than an amount of the driving current output from the pixel circuit of the fourth sub-pixel. The first sub-pixel and the fourth sub-pixel may emit green light. The driving transistor may be a P-type transistor.

The pixel circuit may include a compensation transistor to connect the gate electrode of the driving transistor to the second electrode of the switching transistor based on a first control signal; and an emission control transistor to output the driving current to the output node based on an emission control signal, and the driving transistor supplies the driving current corresponding to the data signal to the light-emitter according to a switching operation of the switching transistor.

In accordance with one or more other embodiments, a method for manufacturing an organic light-emitting display panel includes providing a mother substrate; forming a plurality of thin film transistors on one surface of the mother substrate; forming pixel electrodes electrically connected to respective ones of the thin film transistors; and forming an organic emission layer on a part of the pixel electrodes. wherein the thin film transistors, the pixel electrodes corresponding to the thin film transistors, and the organic emission layer corresponding to the pixel electrodes form first to third sub-pixels in a first region of the mother substrate and form fourth to sixth sub-pixels in a second region of the mother substrate, and wherein an overlap area of a gate electrode and a pixel electrode in the first sub-pixel in the first region of the mother substrate is smaller than an overlap area of a gate electrode and a pixel electrode in the fourth sub-pixel in the second region of the mother substrate.

A plurality of first thin film transistors, a plurality of second thin film transistors, and a plurality of third thin film transistors may be in the first region of the mother substrate, a plurality of fourth thin film transistors, a plurality of fifth thin film transistors, and a plurality of sixth thin film transistors may be in the second region of the mother substrate, and the first region may be an edge region of the mother substrate.

The first and fourth sub-pixels may emit a same color of light, the second and fifth sub-pixels may emit a same color of light, and the third and sixth sub-pixels may emit a same color of light. The organic emission layer of the first sub-pixel and the organic emission layer of the fourth sub-pixel may emit green light. Each of the thin film transistors may be a P-type thin film transistor. An area of the gate electrode of the first sub-pixel may be smaller than an area of the gate electrode of the fourth sub-pixel.

BRIEF DESCRIPTION OF THE DRAWINGS

Features will become apparent to those of skill in the art by describing in detail exemplary embodiments with reference to the attached drawings in which.

DETAILED DESCRIPTION

Figure 1:
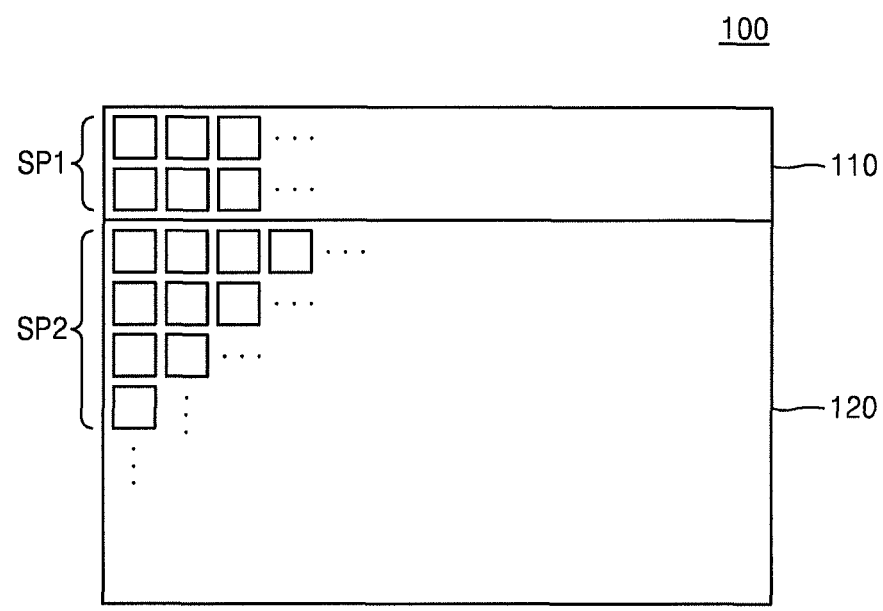
FIG. 1 illustrates an embodiment of an organic light-emitting display panel.

Example embodiments are described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art. The embodiment may be combined to form additional embodiments.

It will also be understood that when a layer or element is referred to as being "on" another layer or substrate, it can be directly on the other layer or substrate, or intervening layers may also be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present. Like reference numerals refer to like elements throughout.

It will be understood that when an element is referred to as being "on," "connected to" or "coupled to" another element, it may be directly on, connected or coupled to the other element or intervening elements may be present. In contrast, when an element is referred to as being "directly on," "directly connected to" or "directly coupled to" another element, there are no intervening elements or layers present. The same is equally applied to other expressions describing relationships of elements, such as "between", "immediately between", or "directly adjacent to".

FIG. 1 illustrates an embodiment of an organic light-emitting display panel 100 which includes a first display region 110 and a second display region 120. The first display region 110 includes a plurality of first pixels SP1, and the second display region 120 includes a plurality of second pixels SP2.

Each of the first pixels SP1 and the second pixels SP2 may include sub-pixels that emit red (R) light, green (G) light, and blue (B) light. Each of the sub-pixels in the first pixels SP1 and the second pixels SP2 includes a pixel circuit, that outputs driving current corresponding to a data signal, and a light-emitting element that emits light based on the driving current.

The pixel circuit includes a driving transistor and a switching transistor. The driving transistor receives the data signal and outputs the driving current corresponding to the data signal to an output node. The switching transistor has a first electrode that receives the data signal and a second electrode connected to a first electrode. The light-emitting element is connected to the output node and emits light by the driving current transferred through the output node.

An overlap area of a gate electrode of the driving transistor and an anode electrode of the light-emitting element in the first pixel SP1 may be smaller than an overlap area of a gate electrode of the driving transistor and an anode electrode of the light-emitting element in the second pixel SP2. For example, the overlap area of the gate electrode of the driving transistor and the anode electrode of the light-emitting element in the sub-pixel in the first pixel SP1 may be smaller than the overlap area of the gate electrode of the driving transistor and the anode electrode of the light-emitting element in the second pixel SP2.

Figure 2:
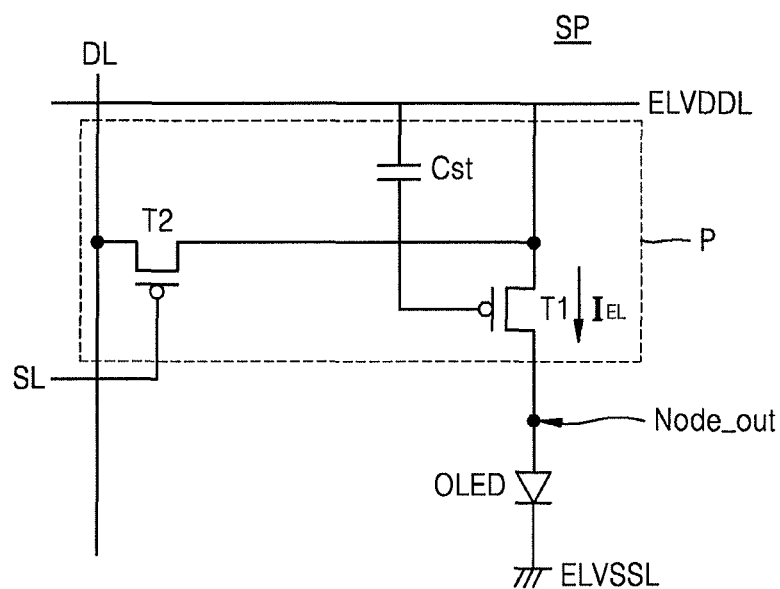
FIG. 2 illustrates an embodiment of a sub-pixel.

FIG. 2 illustrates an embodiment of a sub-pixel circuit SP and a light-emitting element OLED of the sub-pixel SP. Referring to FIG. 2, the sub-pixel circuit SP includes a pixel circuit P and a light-emitting element OLED. The pixel circuit P includes a driving transistor T1 and a switching transistor T2.

The switching transistor T2 includes a first electrode that receives a data signal provided from a data line DL, and a second electrode connected to a first electrode of the driving transistor T1.

The driving transistor T1 receives the data signal from the switching transistor T2 and outputs driving current $I_{EL}$ corresponding to the received data signal to an output node Node_out. The first electrode of the driving transistor T1 is connected to a first driving voltage line ELVDDL that supplies a first driving voltage. A second electrode of the driving transistor T1 may be connected to an anode electrode of the light-emitting element OLED through the output node Node_out. The gate electrode of the switching transistor T2 is connected to a scan line SL that supplies a scan signal for transferring the data signal to the driving transistor T1.

The pixel circuit P includes a storage capacitor $C_{st}$ having a first electrode connected to the first driving voltage line ELVDDL and a second electrode connected to a gate electrode of the driving transistor T1.

The light-emitting element OLED has an anode electrode connected to the output node Node_out. The light-emitting element OLED emits light according to the driving current $I_{EL}$ transferred from the driving transistor T1.

The potential of the output node Node_out may be based on or equal to a potential of the second electrode of the driving transistor T1 and a potential of the anode electrode of the light-emitting element OLED. In addition, the cathode electrode of the light-emitting element OLED is connected to a second driving voltage line ELVSSL. A second driving voltage flowing through the second driving voltage line ELVSSL may be a reference voltage, e.g., a ground voltage.

The light-emitting element OLED may emit R light, G light, or B light. The light-emitting element OLED emits light with a brightness corresponding to the amount of the driving current $I_{EL}$.

As illustrated in FIG. 1, each of the pixels SP1 and SP2 may include one or more sub-pixels SP in the organic light-emitting display panel 100 arranged in a matrix.

The overlap area of the gate electrode of the driving transistor T1 and the anode electrode of the light-emitting element OLED in the first pixel SP1 may be smaller than the overlap area of the gate electrode of the driving transistor T1 and the anode electrode of the light-emitting element OLED in the second pixel SP2.

As described above, since the first pixel SP1 is formed in the first display region and the second pixel SP2 is formed in the second display region, the overlap areas of the gate electrode of the driving transistor T1 and the anode electrode of the light-emitting element OLED in the pixels formed in the first display region and the second display region are different from each other.

As illustrated in FIG. 1, the first display region 110 may be an edge region of the organic light-emitting display panel 100. On the other hand, a parasitic capacitance $C_{par}$ may be formed between the gate electrode of the driving transistor T1 and the anode electrode of the light-emitting element OLED. A variation $\Delta V_{data}$ of the data voltage applied from the data line DL due to the parasitic capacitance $C_{par}$ may have a relationship with respect to the storage capacitor $C_{st}$ and the parasitic capacitance $C_{par}$ based on Equation 1.

$$\Delta V_{data} = \Delta V_{Anode} \times \frac{C_{par}}{C_{par} + C_{st}} \quad (1)$$

The magnitude of the capacitance is proportional to the area of two facing electrodes and is inversely proportional to the distance between the two electrodes. Therefore, the magnitude of the parasitic capacitance $C_{par}$ may be adjusted by changing the overlap area of the gate electrode of the driving transistor T1 and the anode electrode of the light-emitting element OLED.

In addition, if the magnitude of the parasitic capacitance $C_{par}$ is increased, the data voltage variation $\Delta V_{data}$ is also increased. Therefore, the data voltage variation $\Delta V_{data}$ may be adjusted by adjusting the magnitude of the parasitic capacitance $C_{par}$.

The data voltage variation $\Delta V_{data}$ may correspond, for example, to a difference between the data voltage $V_{data}$ applied from the data line DL to the gate electrode of the driving transistor T1 through the switching transistor T2 and the potential of the gate electrode of the driving transistor T1 when the light-emitting element OLED emits light by the driving current $I_{EL}$.

As described above, if the data voltage variation $\Delta V_{data}$ is adjusted by adjusting the magnitude of the parasitic capacitance $C_{par}$, the amount of current flowing through the light-emitting element OLED may be adjusted and the luminance of light emitted from the light-emitting element OLED may be adjusted.

Figure 3:
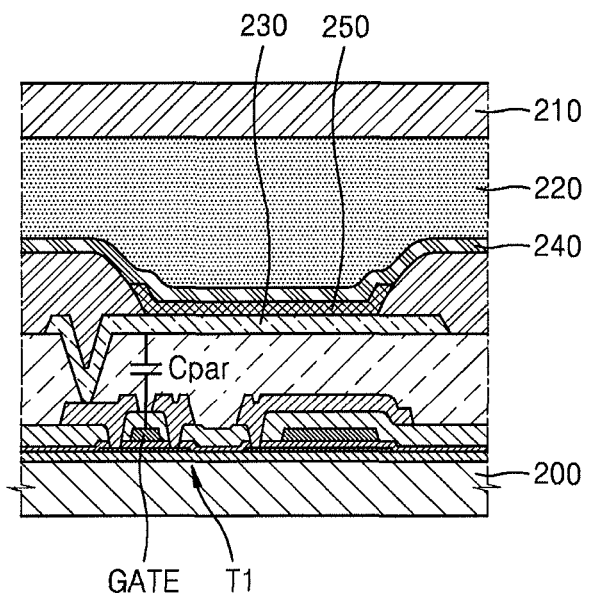
FIG. 3 illustrates another view of the sub-pixel.

FIG. 3 illustrates a cross-sectional view of a sub-pixel, which, for example, may correspond to sub-pixel SP in the organic light-emitting display panel 100 or a different sub-pixel. The cross-sectional view in FIG. 3 illustrates one sub-pixel among a plurality of sub-pixels in each pixel or in the display panel 100.

Referring to FIG. 3, the sub-pixel SP includes a lower substrate 200, an upper substrate 210 facing the lower substrate 200, a driving transistor T1 on the lower substrate and between the lower substrate 200 and upper substrate 210, a light-emitting element electrically connected to the driving transistor T1, and a conductive polymer layer 220 in a space between the light-emitting element and the upper substrate 210.

The lower substrate 200 may include various materials. Examples include glass, metal, or a plastic material. Examples of the plastic material include polyethylene terephthalate (PET), polyethylene naphthalate (PEN), and polyimide. The lower substrate 200 has a display region having a plurality of pixels and a peripheral region surrounding the display region.

The light-emitting element includes an intermediate layer 250 between an anode electrode 230 and a opposite electrode 240. The intermediate layer 250 includes an emission layer. The opposite electrode 240 may be one body in the light-emitting elements of the plurality of sub-pixels.

The anode electrode 230 may be a reflective electrode. For example, the anode electrode 230 may include a reflection film made of silver (Ag), magnesium (Mg), aluminum (Al), platinum (Pt), palladium (Pd), gold (Au), nickel (Ni), neodymium (Nd), iridium (Ir), chromium (Cr), or any compounds thereof, and a layer including indium thin oxide (ITO), indium zinc oxide (IZO), zinc oxide (ZnO), or indium oxide (In2O3). The anode electrode 230 may be made from a different material in another embodiment. The anode electrode 230 is disposed in the display region of the lower substrate 200.

Since a gate electrode GATE of the driving transistor T1 and the anode electrode 230 overlap each other, with an insulating layer therebetween, a parasitic capacitance $C_{par}$ forms between the gate electrode GATE and anode electrode 230.

As described above with reference to FIG. 2, since the luminance of light emitted from the light-emitting element OLED is adjusted by adjusting the magnitude of the parasitic capacitance $C_{par}$, the magnitude of the parasitic capacitance $C_{par}$ may be adjusted by adjusting the area of the gate electrode GATE.

As the area of the gate electrode GATE increases, the overlap area of the gate electrode GATE and the anode electrode 230 is increased, and therefore the magnitude of the parasitic capacitance $C_{par}$ is increased. As the area of the gate electrode GATE decreases, the overlap area of the gate electrode GATE and the anode electrode 230 is reduced, and therefore the magnitude of the parasitic capacitance $C_{par}$ is reduced.

Figure 4:
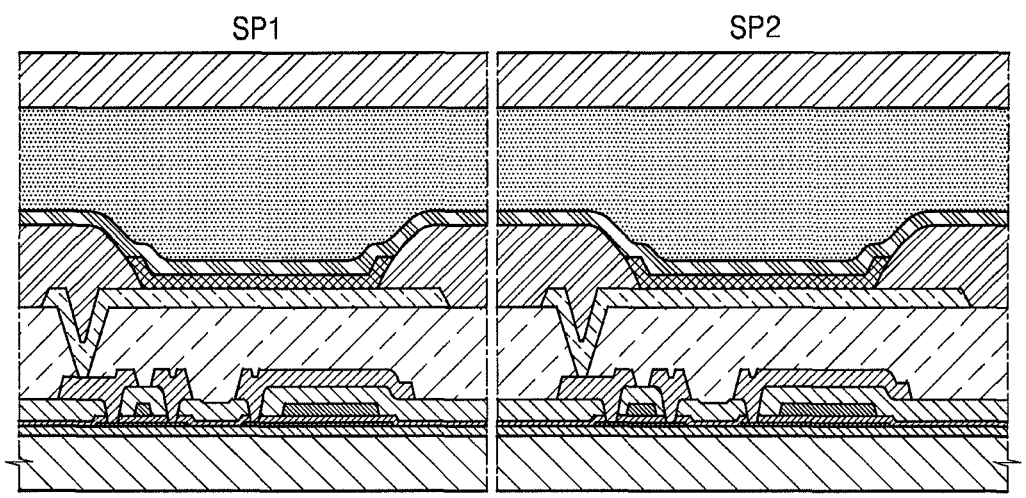
FIG. 4 illustrates another embodiment of a sub-pixel.

FIG. 4 illustrates another embodiment which includes two sub-pixels SP1 and SP2. In one implementation, each pixel includes multiple sub-pixels, e.g., three sub-pixels that emit R light, G light, and B light, respectively. In FIG. 4, two sub-pixels SP1 and SP2 of the three sub-pixels are shown for illustrative purposes only. The first sub-pixel SP1 and the second sub-pixel SP2 are sub-pixels formed in the first display region 110 and the second display region 120, respectively, in FIG. 1.

Referring to FIG. 4, the area of a gate electrode of a driving transistor of the first sub-pixel SP1 is larger than the area of a gate electrode of a driving transistor of the second sub-pixel SP2. Therefore, the overlap area of the gate electrode of the driving transistor and an anode electrode of a light-emitting element is larger in the first sub-pixel SP1 than in the second sub-pixel SP2. The magnitude of the parasitic capacitance between the gate electrode of the driving transistor and the anode electrode of the light-emitting element is greater in the first sub-pixel SP1 than in the second sub-pixel SP2.

As described with reference to FIG. 3 and Equation 1, as the magnitude of the parasitic capacitance is increased, the data voltage variation according to the anode voltage variation is increased. Therefore, the data voltage variation according to the anode voltage variation is larger in first sub-pixel SP1 than in the second sub-pixel SP2.

A smaller amount of driving current may flow in a sub-pixel formed in the edge region of a display panel than in the central region of the display panel. This may cause color deviation in the display panel.

In FIG. 1, the first display region 110 corresponds to the edge region of the organic light-emitting display panel 100, and the second display region 120 corresponds to the central region of the organic light-emitting display panel 100. Therefore, the amount of driving current flowing through the first sub-pixel SP1 in the first display region 110 may be less than the amount of driving current flowing through the second sub-pixel SP2 in the second display region 120.

As the magnitude of the parasitic capacitance $C_{par}$ decreases, the data voltage variation according to the anode voltage variation is reduced. Thus, when the magnitude of the parasitic capacitance $C_{par}$ of the sub-pixel, through which a small amount of driving current flows, is reduced, influence based on the difference in driving current may be reduced, which reduces luminance deviation.

Therefore, color deviation, which is caused by a difference in position at which sub-pixels are formed, may be reduced or prevented, when the area of the gate electrode of the driving transistor of the first sub-pixel SP1 in the edge region of the display panel is smaller than the area of the gate electrode of the driving transistor of the second sub-pixel SP2 in the central region of the display panel.

Figure 5:
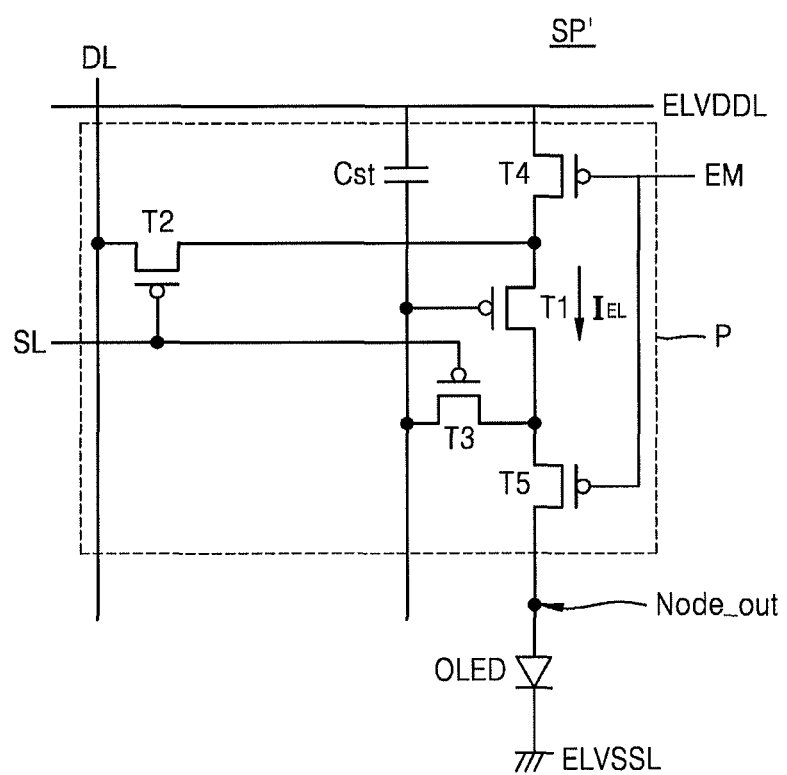
FIG. 5 illustrates another embodiment of a pixel circuit and a light-emitting element of a sub-pixel.

FIG. 5 illustrates another embodiment of a sub-pixel SP' and a light-emitting element OLED. The sub-pixel SP' includes a pixel circuit P having five thin film transistors (TFTs).

Like the pixel circuit P in FIG. 2, the pixel circuit P may include a driving transistor T1 and a switching transistor T2. The switching transistor T2 includes a first electrode to receive a data signal from a data line DL and a second electrode connected to a first electrode of the driving transistor T1.

The driving transistor T1 receives the data signal from the switching transistor T2 and outputs driving current $I_{EL}$ corresponding to the received data signal to an output node Node_out. The first electrode of the driving transistor T1 is connected to a first driving voltage line ELVDDL that supplies a first driving voltage, and a second electrode of the driving transistor T1 is connected to an anode electrode of the light-emitting element OLED through the output node Node_out.

A gate electrode of the switching transistor T2 is connected to a scan line SL that supplies a scan signal for transferring the data signal to the driving transistor T1.

The pixel circuit P includes a storage capacitor $C_{st}$ having a first electrode connected to the first driving voltage line ELVDDL and a second electrode connected to a gate electrode of the driving transistor T1.

The anode electrode of the light-emitting element OLED may be connected to the output node Node_out. The light-emitting element OLED may emit light according to the driving current $I_{EL}$ transferred from the driving transistor T1.

The pixel circuit P may include a compensation transistor T3 and emission control transistors T4 and T5. The compensation transistor T3 connects the gate electrode of the driving transistor T1 to the second electrode of the driving transistor T1 based on a first control signal. The emission control transistors T4 and T5 output the driving current $I_{EL}$ to the output node Node_out based on an emission control signal. The driving transistor T1 supplies the driving current $I_{EL}$ corresponding to the data signal to the light-emitting element OLED according to the switching operation of the switching transistor T2.

The structure of the driving transistor T1 and the light-emitting element OLED may be substantially the same as the structure of the sub-pixel in FIGS. 3 and 4. Thus, if left unresolved, parasitic capacitance $C_{par}$ may form between the gate electrode of the driving transistor T1 and the anode electrode of the light-emitting element OLED. In one embodiment of the sub-pixel SP', the magnitude of the parasitic capacitance $C_{par}$ is adjusted by adjusting the area of the gate electrode of the driving transistor T1.

As described above with reference to FIGS. 1 to 4, when a difference in driving current occurs according to the position of the display panel and color deviation is caused by the difference in the driving current, the color deviation may be reduced or prevented by reducing the area of the gate electrode of the driving transistor T1 with respect to the sub-pixel in the edge region of the display panel.

Figure 6:
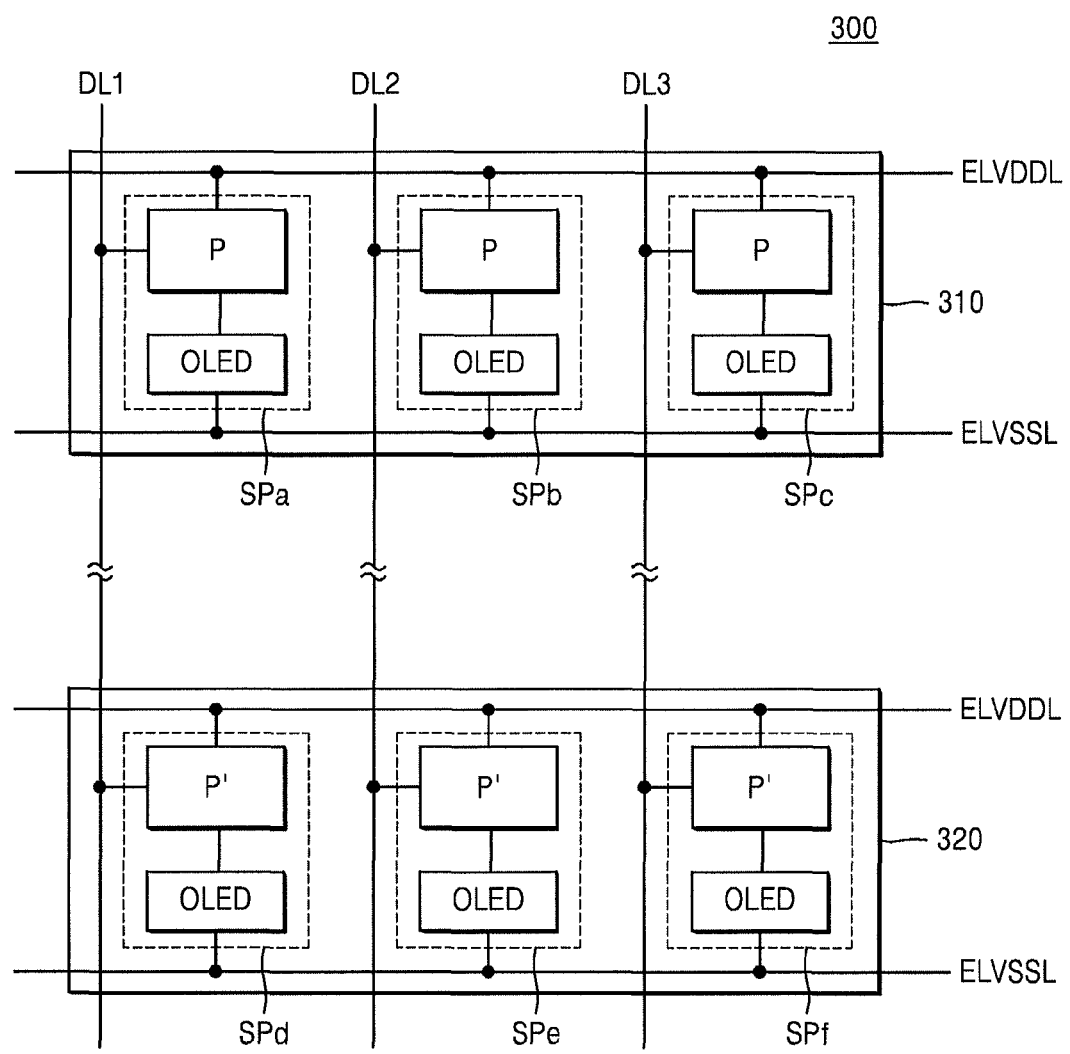
FIGS. 6 and 7 illustrate an embodiment of sub-pixels in organic light-emitting display panels.
Figure 7:
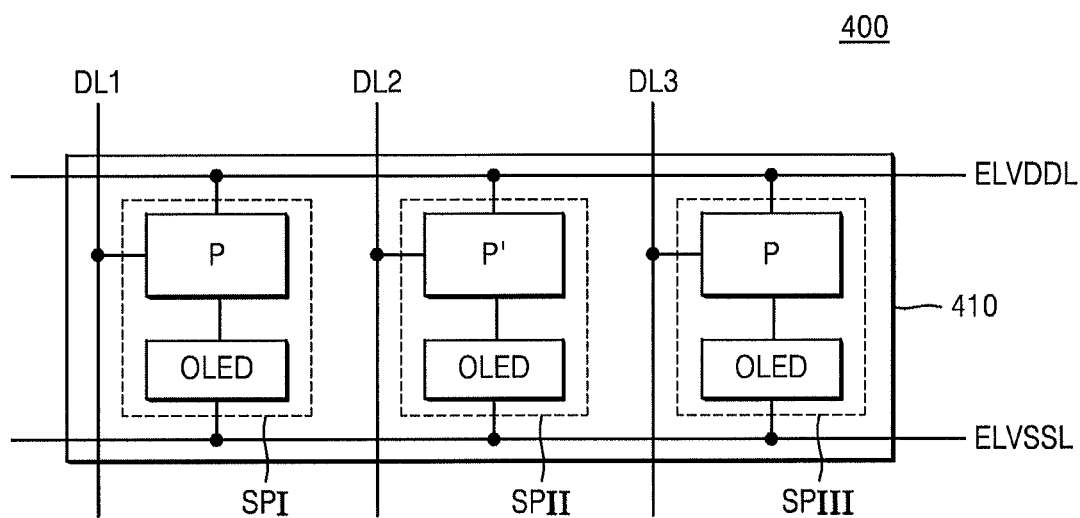

FIGS. 6 and 7 illustrate an embodiment of sub-pixels in organic light-emitting display panels 300 and 400. Referring to FIG. 6, the organic light-emitting display panel 300 includes a first display region 310 and a second display region 320. The first display region 310 includes first, second, and third sub-pixels SPa, SPb, and SPc, and the second display region 320 includes fourth, fifth, and sixth sub-pixels SPd, SPe, and SPf.

Each of the first to sixth sub-pixels SPa, SPb, SPc, SPd, SPe, and SPf include a pixel circuit and a light-emitting element. The pixel circuit includes a driving transistor, a storage capacitor, and a switching transistor. The driving transistor receives a data signal and output driving current corresponding to the data signal to an output node. The storage capacitor stores a voltage difference between the driving voltage and a voltage of a gate electrode of the driving transistor. The switching transistor has a first electrode to receive the data signal and a second electrode connected to a first electrode of the driving transistor. The light-emitting element is connected to the output node and emits light by the driving current transferred through the output node.

Therefore, the pixel circuit P of the first, second, and third sub-pixels SPa, SPb, and SPc and the pixel circuit P' of the fourth, fifth, and sixth sub-pixels SPd, SPe, and SPf have a configuration of the pixel circuit in FIG. 2. The first, second, and third sub-pixels SPa, SPb, and SPc emit R light, G light, and B light, and the fourth, fifth, and sixth sub-pixels SPd, SPe, and SPf emit R light, G light, and B light, respectively.

The first display region 310 corresponds to the edge region of the organic light-emitting display panel 300. As described above, due to current deviation, color deviation may occur in the edge region of the display panel if left unresolved. Therefore, the area of the gate electrode of the driving transistor of the pixel circuit P of the first, second, and third sub-pixels SPa, SPb, and SPc in the first display region 310 may be smaller than the area of the gate electrode of the driving transistor of the pixel circuit P' of the fourth, fifth, and sixth sub-pixels SPd, SPe, and SPf in the second display region 320.

FIG. 7 illustrates an embodiment including plurality of sub-pixels SPI, SPII, and SPIII in a first display region 410 of an organic light-emitting display panel 400. The sub-pixels SPI, SPII, and SPIII may emit R light, G light, and B light.

The first display region 410 corresponds to the edge region of the organic light-emitting display panel 400. As described above, color deviation may occur because the amount of driving current flowing through a light-emitting element is reduced in the first display region 410. This phenomenon may noticeably occur in the sub-pixel that emits G light. If the amount of driving current flowing through the light-emitting element that emits G light is reduced, the luminance of R light and B light is relatively increased. Consequently, purple light may appear on the entire panel.

This limitation may be reduced or prevented by adjusting the magnitude of parasitic capacitance between the anode electrode of the light-emitting element and the gate electrode of the driving transistor of the second sub-pixel SPII that emits G light, among the sub-pixels SPI, SPII, and SPIII in the first display region 410 of the organic light-emitting display panel 400. For example, the influence of current deviation may be reduced when the area of the gate electrode of the driving transistor of the second sub-pixel SPII is smaller than the area of the gate electrode of the driving transistor of the first sub-pixel SPII and the third sub-pixel SPIII.

Figure 8:
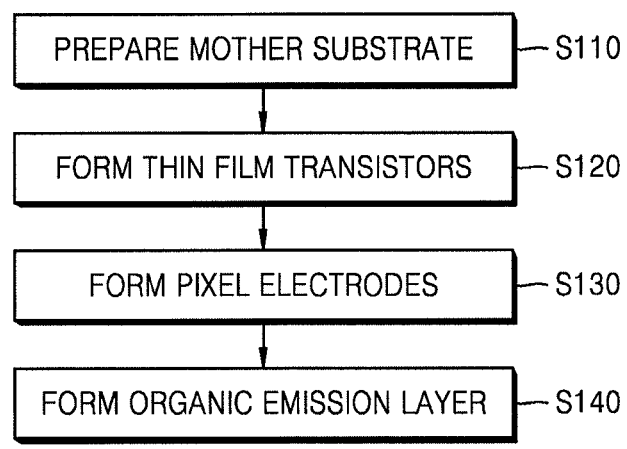
FIG. 8 illustrates an embodiment of a method for manufacturing an organic light-emitting display panel.

FIG. 8 illustrates an embodiment of a method for manufacturing an organic light-emitting display panel. The method includes preparing a mother substrate (S110), forming a plurality of TFTs on one surface of the mother substrate (S120), forming a plurality of pixel electrodes electrically connected to the TFTs (S130), and forming an organic emission layer on a part of the pixel electrodes (S140).

The TFTs, the pixel electrodes corresponding to the TFTs, and the organic emission layer corresponding to the pixel electrodes may form first, second, and third sub-pixels in a first region of the mother substrate and form fourth, fifth, and sixth sub-pixels in a second region of the mother substrate. The first region may be an edge region of the mother substrate.

At this time, the overlap area of the gate electrode and the pixel electrode in the first sub-pixel in the first region of the mother substrate is smaller than the overlap area of the gate electrode and the pixel electrode in the fourth sub-pixel in the second region of the mother substrate. For example, in the first region of the mother substrate, a plurality of first TFTs, a plurality of second TFTs, and a plurality of third TFTs are formed to define the first, second, and third sub-pixels.

In the second region of the mother substrate, a plurality of fourth TFTs, a plurality of fifth TFTs, and a plurality of sixth TFTs are formed to define the fourth, fifth, and sixth sub-pixels.

The first and fourth sub-pixels, the second and fifth sub-pixels, and the third and sixth sub-pixels may emit the same color light. In particular, the organic emission layers of the first and fourth sub-pixels may emit G light. In addition, the TFTs may be P-type TFTs, and the area of the gate electrode of the first sub-pixel may be smaller than the area of the gate electrode of the fourth sub-pixel.

In the organic light-emitting display panel manufactured on the mother substrate, the luminance ratio of the respective sub-pixels is determined at the central region of the mother substrate. Color deviation may occur according to the positions of the respective sub-pixels on the mother substrate.

In the sub-pixels in the edge region of the mother substrate, a smaller amount of driving current may flow compared to sub-pixels in other regions. If left unresolved, the emission luminance of the corresponding sub-pixels may be degraded, and thus an image may not be displayed with desired luminance. Such a limitation may occur more noticeably in the sub-pixel that emits G light.

When the first and fourth sub-pixels emit G light, the first sub-pixel is formed in the first region of the mother substrate and the fourth sub-pixel is formed in the second region of the mother substrate. Therefore, the amount of driving current in the first sub-pixel may be smaller than the amount of driving current in the fourth sub-pixel.

The emission luminance of the light-emitting element of the sub-pixel is increased as the amount of driving current flowing through the light-emitting element is increased. The amount of driving current is increased as the magnitude of the data voltage applied to the sub-pixel is increased.

For example, the emission luminance of the light-emitting element may be adjusted by adjusting the magnitude of the data voltage applied to the sub-pixel. The magnitude of the data voltage is influenced by the magnitude of the parasitic capacitance formed between the gate electrode of the driving transistor and the anode electrode of the light-emitting element. The relationship between the magnitude of the data voltage and the magnitude of the parasitic capacitance may be the same as that described with reference to Equation 1.

Therefore, in the sub-pixel through which a smaller amount of driving current flows due to the current deviation, as compared with other sub-pixels that emit the same color light, the influence of the current deviation may be reduced by reducing the magnitude of the parasitic capacitance.

As described above, in a case where the amount of driving current flowing through the G sub-pixel (first sub-pixel) formed in the first region of the mother substrate is smaller than the amount of driving current flowing through the G sub-pixel (fourth sub-pixel) formed in the second region of the mother substrate, the color deviation may be solved by reducing the magnitude of the parasitic capacitance in the G sub-pixel formed in the first region of the mother substrate.

On the other hand, the color deviation may more noticeably occur in the sub-pixel emitting G light because the sensitivity of the light-emitting element emitting the G light to the driving current. In the sub-pixel that emits R or B light, current deviation may also occur. Therefore, when the luminance of the R or B light is reduced in the first region of the mother substrate and thus color deviation occurs, the color deviation may be reduced or minimized by adjusting the magnitude of the parasitic capacitance of the R or B sub-pixel (second or third sub-pixel) in the first region of the mother substrate.

Figure 9:
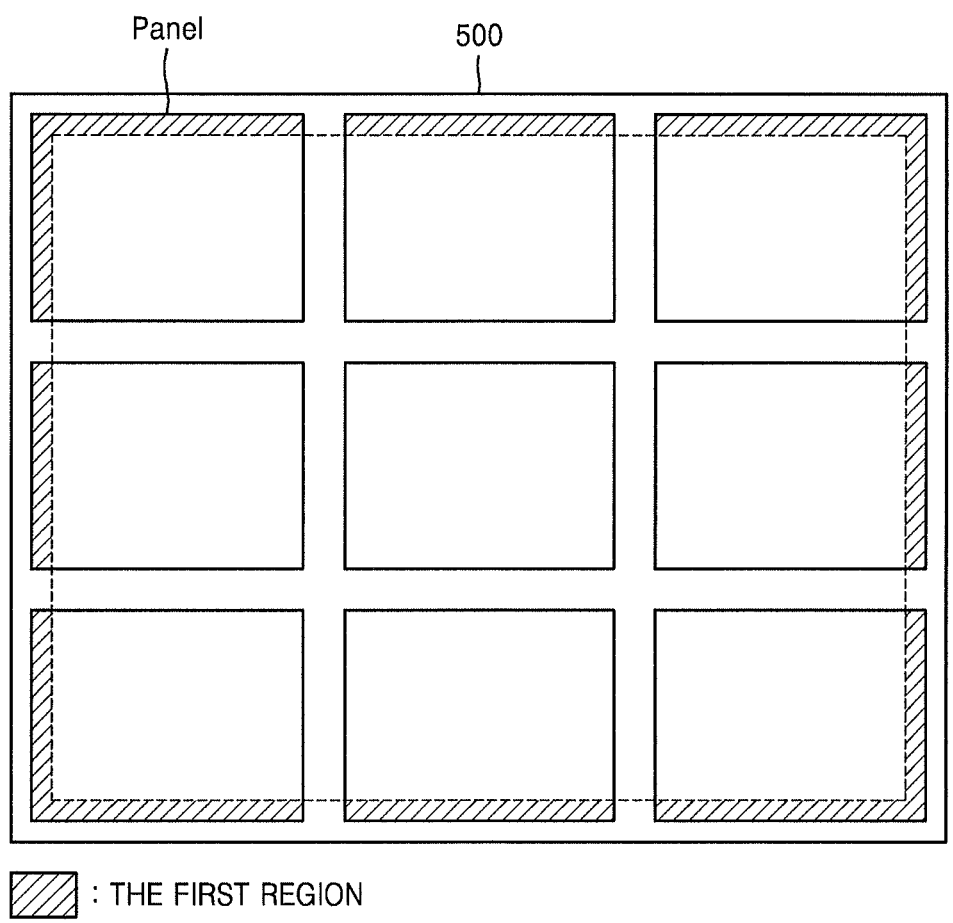
FIG. 9 illustrates an embodiment of a mother substrate and an organic light-emitting display panel.

FIG. 9 illustrates an embodiment of a display panel manufactured by the method in FIG. 8. Referring to FIG. 9, a plurality of organic light-emitting display panels are formed on a mother substrate 500.

As described above with reference to FIG. 8, the color deviation in the edge region of the mother substrate may be reduced or prevented when the magnitude of the parasitic capacitance of the sub-pixel formed in the first region of the mother substrate is less than the magnitude of the parasitic capacitance of the sub-pixel formed in the region except for the first region, that is, the second region.

Since the magnitude of the parasitic capacitance is proportional to the overlap area of the gate electrode of the driving transistor and the anode electrode of the light-emitting element in the sub-pixel, it is possible to change the magnitude of the parasitic capacitance by adjusting the area of the gate electrode of the driving transistor.

Furthermore, the magnitude of the parasitic capacitances of all sub-pixels in the first region may be less than the magnitude of the parasitic capacitances of the sub-pixels formed in the second region. Also, the magnitude of the parasitic capacitance may be small in only the sub-pixel emitting G light among the sub-pixels in the first region.

By way of summation and review, the amount of driving current for enabling a light-emitting element is based on the magnitude of a driving voltage. In order to set the driving voltage, a luminance ratio may be determined at a central portion of a panel. If the in-plane current of the panel is constantly maintained, the luminance ratio is constantly applied to a plane. Hence, color deviation may not occur for a pixel.

However, in an actual panel, current deviation may occur in the plane to cause color deviation. Also, the efficiency of an organic light-emitting material emitting green light tends to be higher than materials emitting red and blue light. In a sub-pixel emitting green light, luminance may change significantly for small changes in applied current.

In accordance with in or more of the aforementioned embodiments, an organic light-emitting display panel may reduce or prevent color deviation in different regions (e.g., upper and lower sides) of a mother substrate.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise indicated. Accordingly, it will be understood by those of skill in the art that various changes in form and details may be made without departing from the spirit and scope of the present invention as set forth in the following claims.

What is claimed is:

1. An organic light-emitting display panel, comprising:
a first display region including a plurality of first sub-pixels; and
a second display region including a plurality of second sub-pixels, wherein each of the first and second sub-pixels includes a pixel circuit having:
a driving transistor to output driving current to an output node based on a data signal;
a storage capacitor to store a voltage difference between the driving voltage and a voltage of a gate electrode of the driving transistor; and
a switching transistor having a first electrode to receive the data signal and a second electrode connected to a first electrode of the driving transistor; and
a light-emitter connected to the output node to emit light based on the driving current transferred through the output node, and
an overlap area of the gate electrode of the driving transistor and an anode electrode of the light-emitter in the first sub-pixel is smaller than an overlap area of the gate electrode of the driving transistor and an anode electrode of the light-emitter in the second sub-pixel.

2. The display panel as claimed in claim 1, wherein the first display region is an edge region of the display panel.

3. The display panel as claimed in claim 1, wherein an amount of the driving current output from the pixel circuit of the first sub-pixel is less than an amount of the driving current output from the pixel circuit of the second sub-pixel.

4. The display panel as claimed in claim 1, wherein an area of the gate electrode of the driving transistor of the first sub-pixel is smaller than an area of the gate electrode of the driving transistor of the second sub-pixel.

5. The display panel as claimed in claim 1, wherein the driving transistor is a P-type transistor.

6. The display panel as claimed in claim 1, wherein the pixel circuit includes:
a compensation transistor to connect the gate electrode of the driving transistor to the second electrode of the switching transistor based on a first control signal; and
an emission control transistor to output the driving current to the output node based on an emission control signal, wherein the driving transistor is to supply the driving current corresponding to the data signal to the light-emitter according to a switching operation of the switching transistor.

7. An organic light-emitting display panel comprising:
a first display region including a plurality of first to third sub-pixels; and
a second display region including a plurality of fourth to sixth sub-pixels, wherein each of the first to sixth sub-pixels includes a pixel circuit having:
a driving transistor to output driving to an output node based on a data signal;
a storage capacitor to store a voltage difference between the driving voltage and a voltage of a gate electrode of the driving transistor; and
a switching transistor having a first electrode to receive the data signal and a second electrode connected to a first electrode of the driving transistor; and
a light-emitter connected to the output node to emit light based on the driving current transferred through the output node, and
an overlap area of the gate electrode of the driving transistor and an anode electrode of the light-emitter in the first sub-pixel is smaller than an overlap area of the gate electrode of the driving transistor and an anode electrode of the light-emitter in the fourth sub-pixel.

8. The display panel as claimed in claim 7, wherein the first display region is an edge region of the display panel.

9. The display panel as claimed in claim 7, wherein the first and fourth sub-pixels emit a same color of light, the second and fifth sub-pixels emit a same color of light, and the third and sixth sub-pixels emit a same color of light.

10. The display panel as claimed in claim 7, wherein an area of the gate electrode of the driving transistor of the first sub-pixel is smaller than an area of the gate electrode of the driving transistor of the fourth sub-pixel.

11. The display panel as claimed in claim 7, wherein an amount of the driving current output from the pixel circuit of the first sub-pixel is less than an amount of the driving current output from the pixel circuit of the fourth sub-pixel.

12. The display panel as claimed in claim 7, wherein the first sub-pixel and the fourth sub-pixel emit green light.

13. The display panel as claimed in claim 7, wherein the driving transistor is a P-type transistor.

14. The display panel as claimed in claim 7, wherein the pixel circuit includes:
- a compensation transistor to connect the gate electrode of the driving transistor to the second electrode of the switching transistor based on a first control signal; and
- an emission control transistor to output the driving current to the output node based on an emission control signal, and
- the driving transistor supplies the driving current corresponding to the data signal to the light-emitter according to a switching operation of the switching transistor.

* * * * *